United States Patent
Seyfried et al.

(10) Patent No.: US 7,385,173 B2
(45) Date of Patent: Jun. 10, 2008

(54) PHOTOSENSITIVE ARRAY DETECTOR FOR SPECTRALLY SPLIT LIGHT

(75) Inventors: Volker Seyfried, Nussloch (DE); Frank Schreiber, Dossenheim (DE)

(73) Assignee: Leica Microsystems CMS GmbH, Wetzlar (DE)

(*) Notice: Subject to any disclaimer, the term of this patent is extended or adjusted under 35 U.S.C. 154(b) by 34 days.

(21) Appl. No.: 11/344,040

(22) Filed: Jan. 31, 2006

(65) Prior Publication Data

US 2006/0169873 A1 Aug. 3, 2006

Related U.S. Application Data

(60) Provisional application No. 60/758,298, filed on Jan. 12, 2006, provisional application No. 60/650,277, filed on Feb. 4, 2005.

(30) Foreign Application Priority Data

Jan. 31, 2005  (DE) .................. 10 2005 004 545
Dec. 13, 2005  (DE) .................. 10 2005 059 948

(51) Int. Cl.
   *H01J 3/14*  (2006.01)
   *G01J 3/30*  (2006.01)
(52) U.S. Cl. ........... 250/216; 250/208.1; 250/226; 356/326; 348/336; 348/345; 359/710; 359/721
(58) Field of Classification Search ............ 250/208.1, 250/216, 226; 257/294, 291, 431, 436, 443; 348/336, 337, 345; 356/326; 359/708, 710, 359/720, 721
See application file for complete search history.

(56) References Cited

U.S. PATENT DOCUMENTS

| | | | |
|---|---|---|---|
| 4,230,942 A | 10/1980 | Stauffer | |
| 6,381,072 B1* | 4/2002 | Burger | 359/622 |
| 6,400,513 B1 | 6/2002 | Southwell | |
| 6,459,484 B1* | 10/2002 | Yokoi | 356/318 |
| 6,486,503 B1* | 11/2002 | Fossum | 257/215 |
| 6,497,488 B1* | 12/2002 | Yamauchi et al. | 353/38 |
| 6,842,289 B2* | 1/2005 | Nishikawa et al. | 359/619 |
| 6,847,784 B2* | 1/2005 | Takato | 396/114 |
| 6,913,373 B2* | 7/2005 | Tanaka et al. | 362/268 |
| 7,009,772 B2* | 3/2006 | Hsiao et al. | 359/619 |
| 7,167,292 B2* | 1/2007 | Yoshida | 359/227 |
| 2001/0028223 A1 | 10/2001 | Kimura | |
| 2002/0036775 A1* | 3/2002 | Wolleschensky et al. | 356/317 |
| 2004/0008411 A1* | 1/2004 | Freese et al. | 359/460 |
| 2005/0012927 A1 | 1/2005 | Seyfried et al. | |

FOREIGN PATENT DOCUMENTS

| JP | 2000304614 | 11/2000 |
|---|---|---|
| WO | WO-0214811 | 2/2002 |

OTHER PUBLICATIONS

Volker Seyfried et al., U.S. Appl. No. 11/343,022, filed Jan. 30, 2006.

* cited by examiner

*Primary Examiner*—Davienne Monbleau
(74) *Attorney, Agent, or Firm*—Darby & Darby

(57) ABSTRACT

A detector includes a photosensitive array including at least one photosensitive surface. A focusing device focuses spectrally split light onto the photosensitive array. The focusing device is located in an optical path upstream from the photosensitive array. The focusing device includes a microlens array including at least one microlens.

25 Claims, 9 Drawing Sheets

PHOTOSENSITIVE ARRAY DETECTOR FOR SPECTRALLY SPLIT LIGHT

Priority is claimed to German Application No. 10 2005 004 545.6, filed Jan. 31, 2005, German Application No. 10 2005 059 948.6, filed Dec. 13, 2005, U.S. Provisional Application No. 60/650,277, filed Feb. 4, 2005, and U.S. Provisional Application No. 60/758,298, filed Jan. 12, 2006, the entire subject matters of all four applications are hereby incorporated by reference herein.

The present invention relates to a detector, especially for the spectral detection of light in a microscope, comprising a photosensitive array having at least one photosensitive surface, whereby a means for focusing a spectrally split light onto the photosensitive array is arranged in a beam path upstream from the photosensitive array.

BACKGROUND

Detectors comprising a photosensitive array having at least one photosensitive surface, whereby a means for focusing a spectrally split light onto the photosensitive array is arranged in a beam path upstream from the photosensitive array, are known in actual practice and are employed, for example, in a confocal microscope for purposes of spectral detection. In this process, downstream from the detection pinhole of the confocal microscope, the light is collimated through a lens, the collimated light is then spectrally split in a dispersing element such as, for instance, in a grating, prism or hologram, and the spectrally split light is focused by means of a lens onto the photosensitive array, for example, a CCD array.

The prior-art systems, however, entail the problem that the achievable spot diameters typically lie in the order of magnitude from 100 µm to 600 µm—depending on the size of the confocal pinhole—in the direction of the spectral splitting as well as in the direction perpendicular thereto. This is many times larger than the size of individual pixels in common photosensitive arrays. Fundamentally, this drawback can be dealt with either by using larger pixels or else by using more pixels in order to read out a single spot. Both approaches, however, significantly increase the requisite readout time per spot, that is to say, per detection wavelength, so that the detection speed is too low for most envisaged tasks.

SUMMARY OF THE INVENTION

Consequently, it is an object of the present invention to provide a detector as well as a spectrometer and a microscope, including a photosensitive array having at least one photosensitive surface, whereby a means for focusing a spectrally split light onto the photosensitive array is arranged in a beam path upstream from the photosensitive array, with which a high detection speed can be achieved with simply designed means.

The present invention provides a detector comprising a photosensitive array having at least one photosensitive surface. A means for focusing a spectrally split light onto the photosensitive array is arranged in a beam path upstream from the photosensitive array. The means for focusing has a microlens array with at least one microlens. The detector may be used for the spectral detection of light in a microscope.

In an inventive manner, it has been first recognized that high detection speeds can very well be achieved in spectral detection with commonly employed photosensitive arrays. To this end, in another inventive manner, a microlens array with at least one microlens has been proposed as the means to focus a spectrally split light onto the photosensitive array. The use of microlenses makes it possible to focus a single detection wavelength or a single detection wavelength range onto a single pixel. As a result, only one single pixel has to be read out in order to detect a single detection wavelength or a single detection wavelength range.

Consequently, the detector according to the invention is a detector with which a particularly high detection speed can be achieved with simply designed means.

In concrete terms, the photosensitive array can be a CCD (charge-coupled device) array or APD (avalanche photodiode) array. Today, CCD arrays are mass-produced items that are widely employed, for example, in digital cameras. APD arrays are much less widespread nowadays, being used only in research laboratories. CCD arrays usually have a filling factor of 100%, that is to say, there are no gaps or spaces between the photosensitive surfaces. An APD array has such gaps between the photosensitive surfaces, said gaps measuring about 150 µm or more.

In the case of a CCD array, the generated charges are transported from one pixel to the next pixel in the manner of a bucket chain. Here, the reading out of the charge and the amplification of the signal are done sequentially. With an APD array, in contrast, the induced charges are amplified and readout at the pixel where they are generated.

A CCD array allows the summation of several photons per pixel during one reading cycle. The maximum photon count here is a function of the pixel surface area. In the case of an APD array, photons are counted individually per pixel. Here, the maximum photon counting rate depends on the dead time of the APD and lies in the order of magnitude of 5 million counts per second.

Pixel arrays of 1000×1000 and larger are common in CCD arrays. The pixel sizes here lie between 5 µm and 20 µm. At the present time, pixel arrays of 64×64 at the maximum are available for APD arrays. The common pixel sizes here lie between 20 µm and 150 µm.

The operation of CCD arrays calls for strong cooling in order to reduce dark noise. APD arrays usually do not require cooling or Peltier cooling.

In order to provide a particularly high detection speed and a particularly reliable detection of spectrally split light, the microlens array may be configured to focus in the direction of the spectral splitting and preferably also in the direction perpendicular thereto. This allows the detector to cover a particularly large space or surface area.

In concrete terms, the microlens array could be a two-dimensional microlens array. As a result, the desired space or surface area is reliably covered.

Examples of microlenses have gradient-index lenses (GRIN). Consequently, the microlenses could comprise at least one gradient-index lens.

Preferred lenses include spherical lenses. Therefore, the microlenses could comprise at least one spherical lens. In a preferred embodiment, the microlenses could be exclusively spherical lenses. Here, the microlens or microlenses could have a spherical opening.

Furthermore, with an eye towards achieving a particularly high detection speed and a particularly reliable detection of spectrally split light, the microlenses could have a combination consisting of a micro-cylinder array which preferably focuses in the direction of the spectral splitting and at least one cylindrical lens which focuses in the direction perpendicular thereto. Fundamentally, the at least one cylindrical lens could be a single cylindrical lens, a micro-cylindrical lens, a rod lens or an array of such lenses. The selection of the at least one cylindrical lens should take into account the application case in question.

As a matter of principle, attention should be paid to ensuring that the focus in both spatial directions is on the photosensitive array in each case. Especially for this purpose, the microlenses could have different focal lengths for the focusing in the two directions. Particularly in this case, the microlenses for the two directions could be arranged with a very simple design on the same substrate. As a result, the microlens array becomes particularly easy to handle. In this context, the microlenses for the two directions could be arranged on different sides of the substrate.

In order to adapt the photosensitive array to an asymmetrical optical resolution, the microlens array could have asymmetrical lenses whereby, in this case—and in general as well—the microlens array could consist of a line or of a single lens.

The microlens array could have a combination of two crossed lens arrays or cylindrical lens arrays, preferably consisting of asymmetrical lenses.

In order to create a particularly easy-to-handle microlens array, the lens arrays or cylindrical lens arrays for the two directions could be arranged on the same substrate. In another advantageous manner, the lens arrays or cylindrical lens arrays for the two directions could be arranged on different sides, for instance, on the front and on the back of the substrate.

In an embodiment having an advantageous design, the microlens array could be used as a window for preferably hermetic sealing, especially vacuum sealing, for deep-cooled CCDs or APDs.

In an advantageous manner, the lens size of the individual microlenses of the microlens array in the direction of the spectral detection could be adapted to the spectral resolution capacity present at the corresponding wavelength. As a result, it is possible to compensate for the non-linear splitting of the spectrum that occurs, for example, when prisms are employed as the dispersing elements.

In another advantageous manner, chromatic errors can be compensated for by individually adapting the individual microlenses.

With the detector according to the invention, it is advantageous that the use of microlenses creates a space between the light-sensitive pixels of the photosensitive array, so that said space can be utilized for additional functions and/or components. For instance, the space created by the microlenses between the light-sensitive pixels of the photosensitive array could be used to arrange at least one shift register. Moreover, alternatively or additionally, the space could be employed to arrange at least one anti-blooming barrier that prevents crosstalk between pixels in case of excessive light.

Likewise alternatively or additionally, the space created by the microlenses between the light-sensitive pixels of the photosensitive array could be used for the addition of different pixels within the detection surface. Another utilization possibility for this space is the absorption of scattered light. For this purpose, suitable absorption means can be arranged in the space.

The microlens array could be surface-coated in order to increase the transmission. As an alternative or in addition to this, the microlens array could have a surface coating, preferably locally, in order to increase the absorption or to reduce the scattered light.

In order to create a detector that is particularly easy to handle, the microlens array could be applied, vapor-deposited or imprinted onto the photosensitive array. As a result, a single component is created that combines the functionality of the microlens array and of the photosensitive array.

The photosensitive array could basically consist of a single light-sensitive pixel with a microlens. In a preferred embodiment, the photosensitive array could have a CCD line array or APD line array. In this context, the data processing should be adapted to the application case in question as well as to the desired level of convenience.

In an advantageous embodiment, the photosensitive array could have parallelized CCDs or APDs or preferably front-illuminated EMCCDs. Fundamentally, back-illuminated EMCCDs as well as front-illuminated EMCCDs could be employed. The fundamental advantage of the back-illuminated EMCCDs is their higher quantum efficiency since the light does not have to pass through the gate structures of the EMCCD chip before it strikes the photoactive surface, something which is normally associated with detection losses. The drawback of the back-illuminated EMCCDs is that they are very thin and thus difficult to manufacture and handle. By using the microlens array according to the invention, space is now available on the front of the EMCCD chip where there is no need for a photoactive surface since the microlens array focuses the light only onto selected chip areas. This space can be utilized for gate structures, so that it is possible to dispense with arranging gates above the photoactive surface. Thus, the front-illuminated EMCCDs, which are easier to manufacture and handle, can be employed while concurrently retaining a high level of quantum efficiency. The quantum efficiency here is in the same range as with the conventional back-illuminated EMCCDs.

The present invention also provides a spectrometer having a detector, the detector comprising a photosensitive array having at least one photosensitive surface. A means for focusing a spectrally split light onto the photosensitive array is arranged in a beam path upstream from the photosensitive array. The means for focusing has a microlens array with at least one microlens.

Furthermore, the present invention also provides a microscope, in particular a confocal or semiconfocal microscope, having a detector comprising a photosensitive array having at least one photosensitive surface. A means for focusing a spectrally split light onto the photosensitive array is arranged in a beam path upstream from the photosensitive array. The means for focusing has a microlens array with at least one microlens. In this context, the microscope could have a single detection pinhole or a multi-spot scanner or a line scanner. In other words, the detector could be employed in confocal microscopes having a single detection pinhole as well as in confocal microscopes or semiconfocal microscopes having multi-spot scanners or line scanners. In the case of a multi-spot scanner, the number of cylindrical lenses or microlenses arranged perpendicularly to the spectral splitting could generally match the number of spots.

With a line scanner, the cylindrical lenses or microlenses arranged perpendicularly to the splitting could be dispensed with as a rule. The number of photosensitive pixels perpendicular to the spectral splitting then matches the number of pixels per scanning line.

With the detector according to the invention, in a manner of speaking, a microlens CCD or microlens APD, and preferably a microlens EMCCD, is provided that can be used in conjunction with a spectrometer and a microscope, especially a confocal microscope, or in conjunction with a line scanner or multi-spot scanner.

Regarding the discussion of the advantages of special embodiments of the detector according to the invention in conjunction with the claimed spectrometer or with the claimed microscope, in order to avoid repetitions, reference is hereby made to the description of these advantages presented in the preceding text.

BRIEF DESCRIPTION OF THE DRAWINGS

The teaching of the present invention can be embodied and refined in different ways. The present invention is elaborated upon below based on exemplary embodiments with reference to the drawings. In the drawings, FIG. 1 a schematic view of an embodiment of a detector according to the invention in a beam path with spectral detection, FIG. 2 a schematic view of another embodiment of a detector according to the invention in a beam path with spectral detection, FIG. 3 a schematic view of an embodiment of a microlens array, whereby cylindrical lenses are arranged on both sides of a substrate, FIG. 4 a schematic view of another embodiment of a microlens array, whereby cylindrical lenses are arranged on both sides of a substrate and the size of the microlenses increases in the direction of the spectral splitting, FIG. 5 a schematic view of another embodiment of a microlens array, whereby cylindrical lenses are arranged on both sides of a substrate, FIG. 6 a schematic view of an example of the utilization of gaps that have become free, for purposes of electronic charge summation on a CCD array, and FIG. 7 a schematic view of a CCD array in comparison to an APD array.

DETAILED DESCRIPTION

Figure 1:
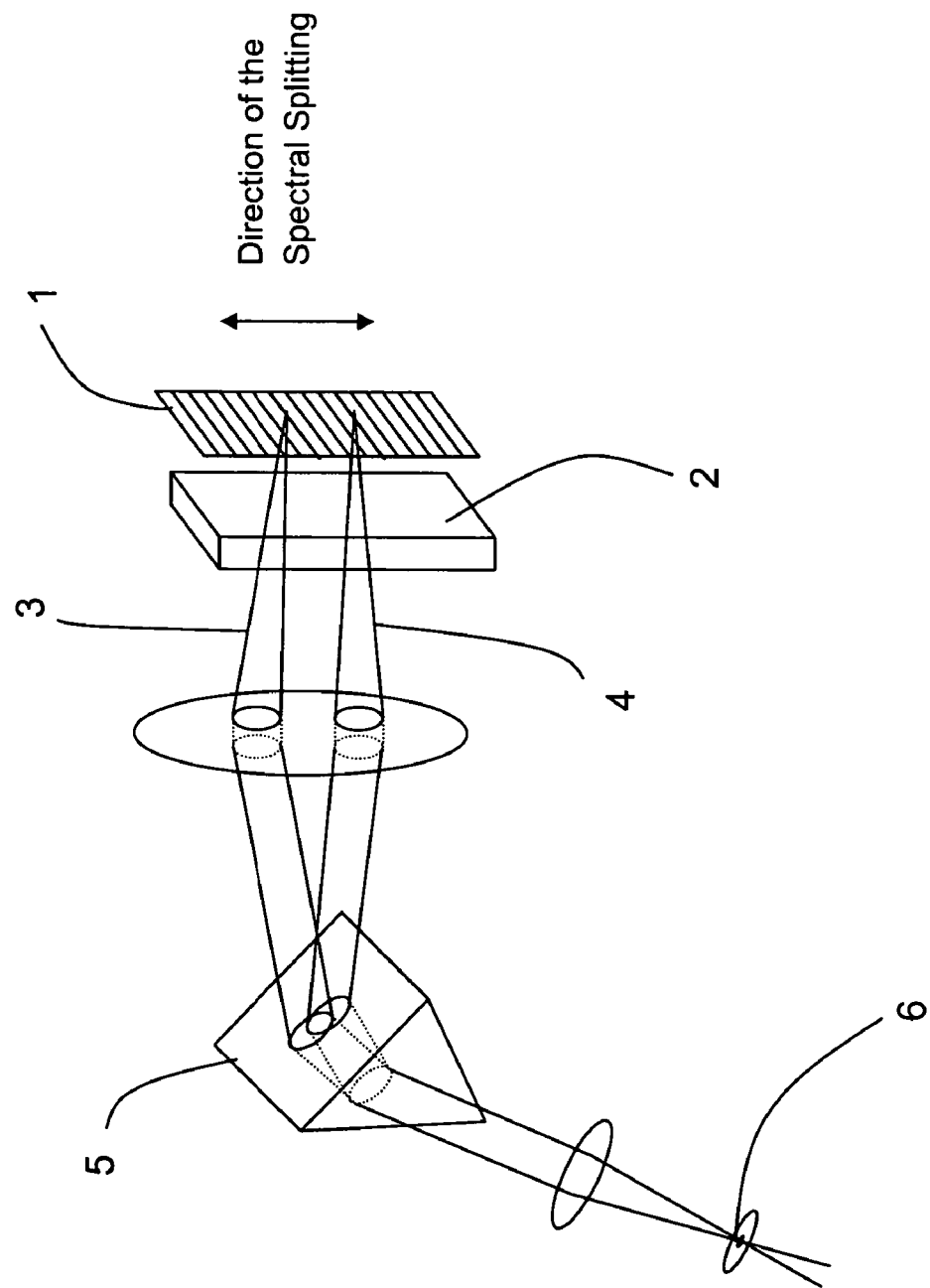

FIG. 1 shows a schematic view of an embodiment of a detector according to the invention, especially for the spectral detection of light in a microscope. The detector has a CCD array 1 with at least one CCD, whereby a means for focusing a spectrally split light onto the CCD array 1 is arranged in a beam path upstream from the CCD array 1. With an eye towards achieving a particularly high detection speed, the means has a microlens array 2 with at least one microlens. In this embodiment as well as in the following embodiments, an APD array could also be employed instead of a CCD array 1.

In the embodiment shown in FIG. 1, two light bundles 3 and 4, which have been spectrally split by means of a prism 5, are focused onto the CCD array 1. A detection pinhole diaphragm 6 is arranged in the beam path upstream from the prism 5.

Figure 2:
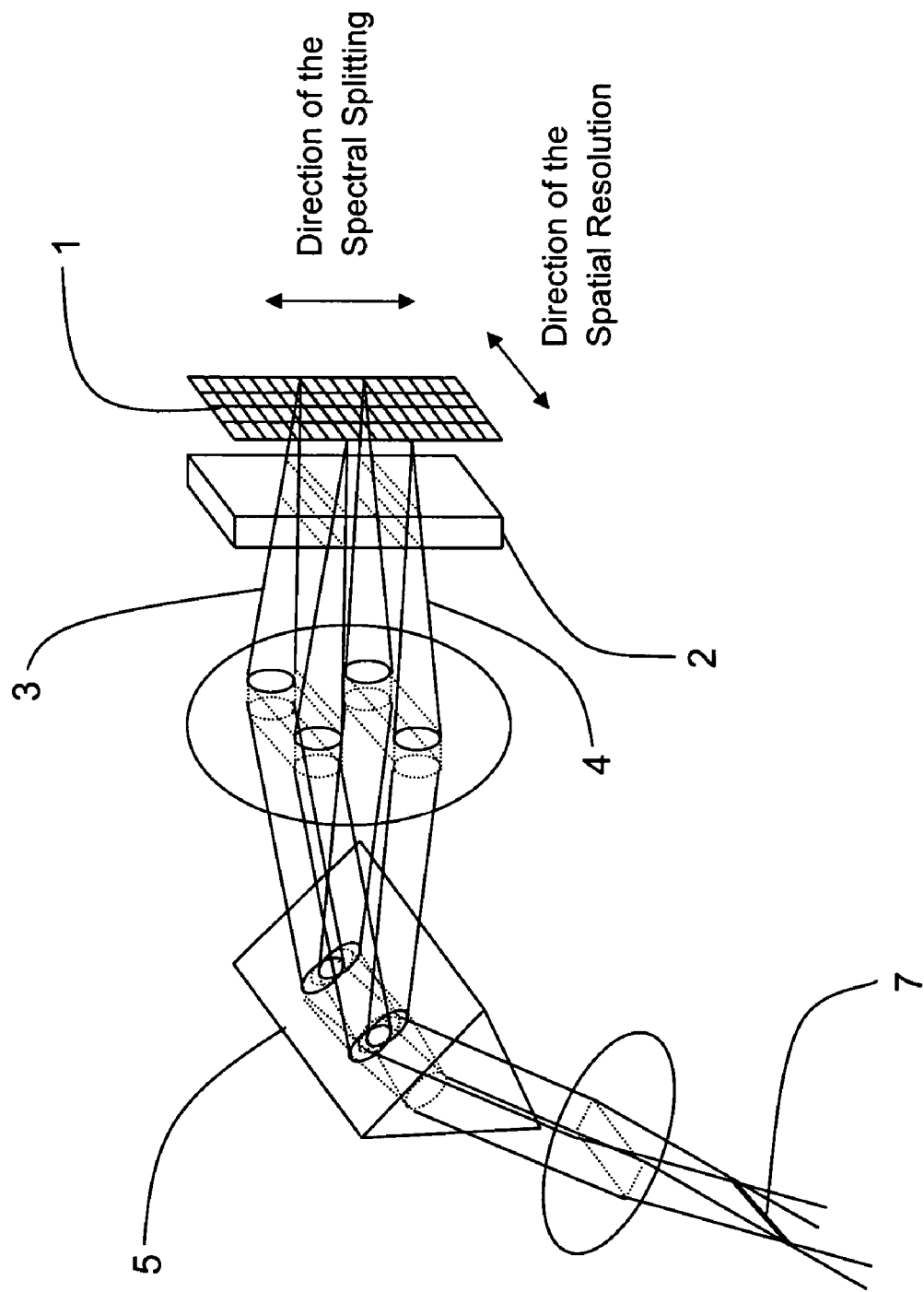

FIG. 2 shows a schematic view of another embodiment of a detector according to the invention, whereby a line scanner is employed here. Moreover, a detection slit diaphragm 7 is arranged in the beam path upstream from the light bundles 3 and 4.

Figure 3:
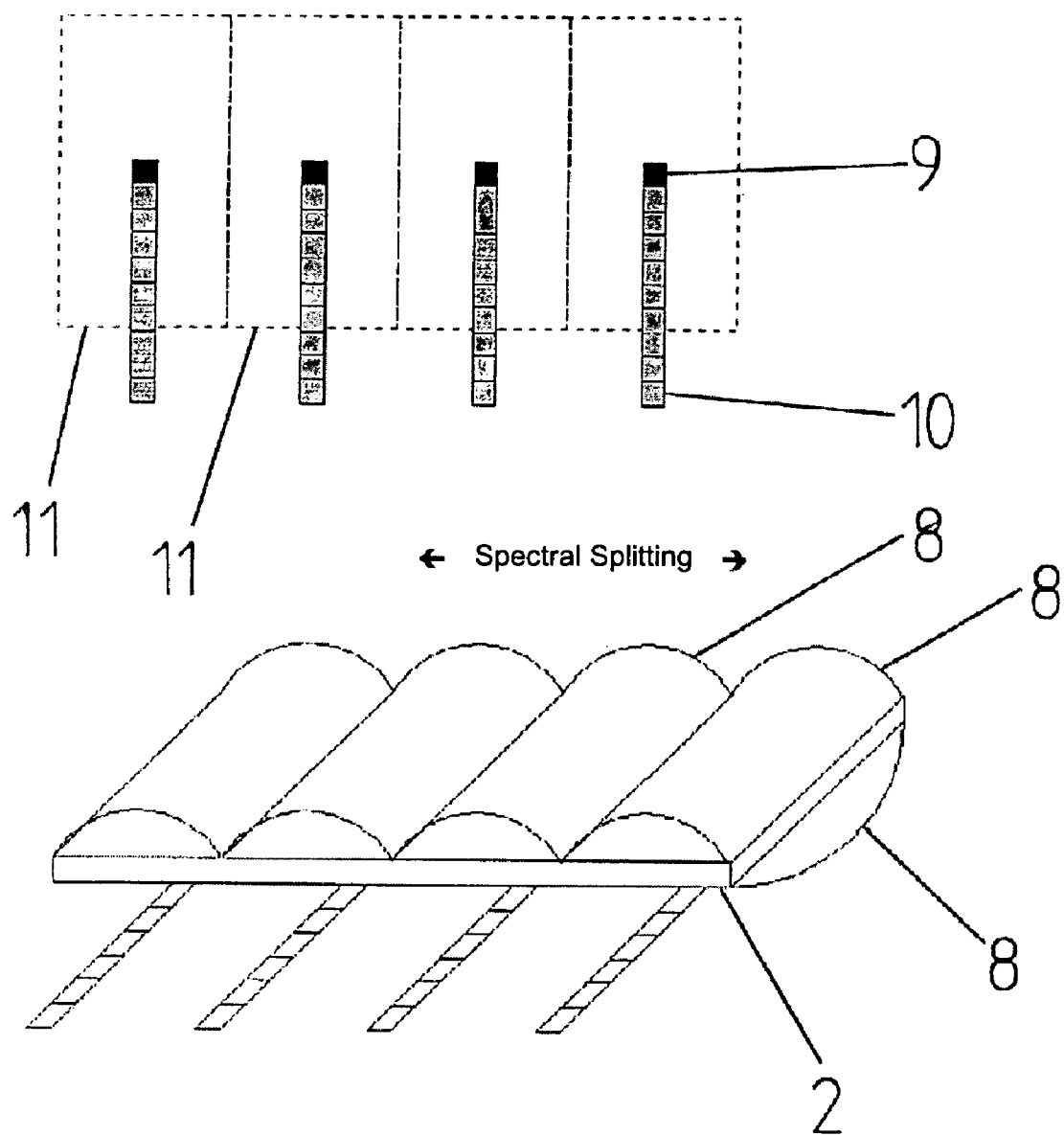
Figure 4:
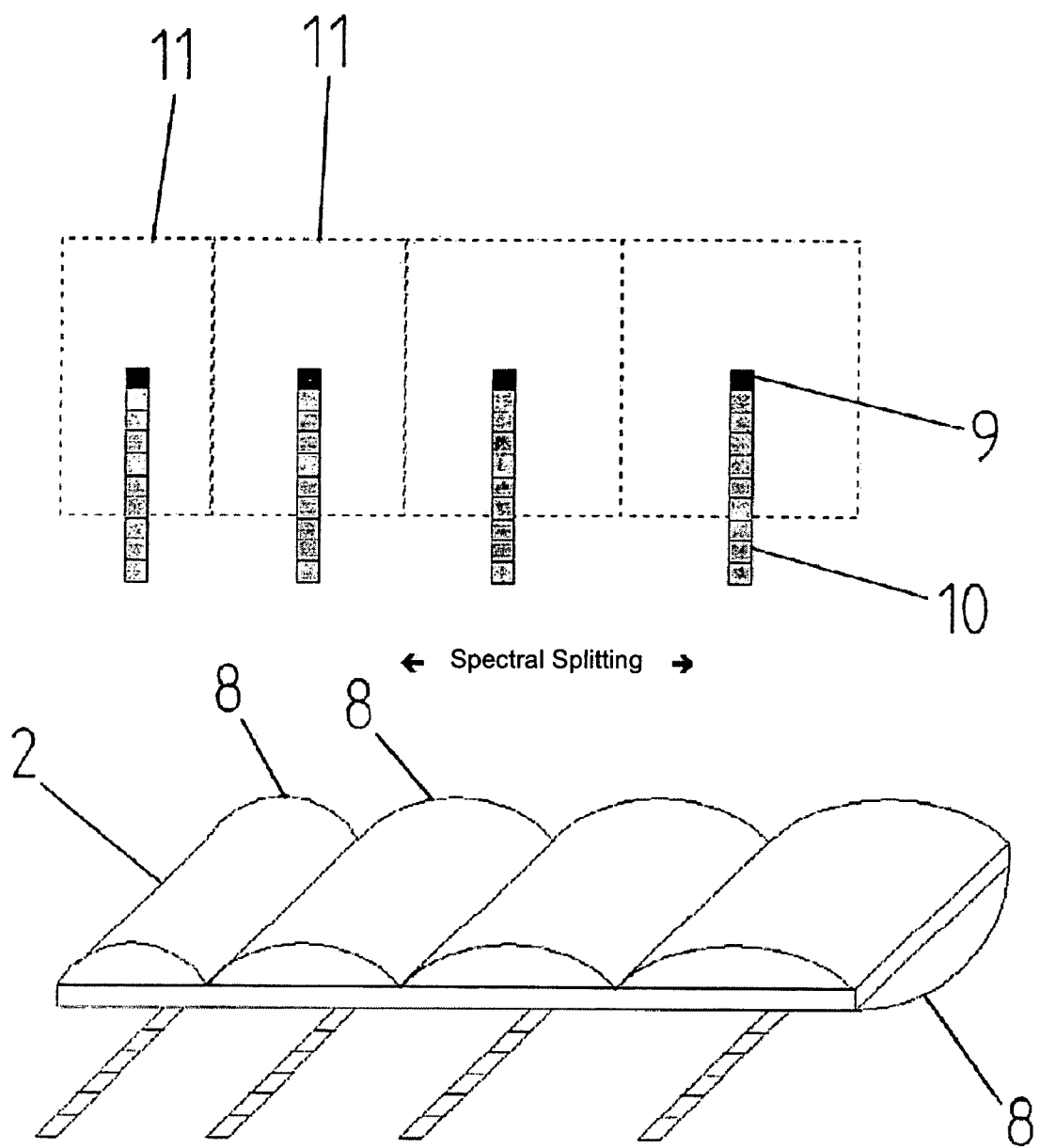
Figure 5:
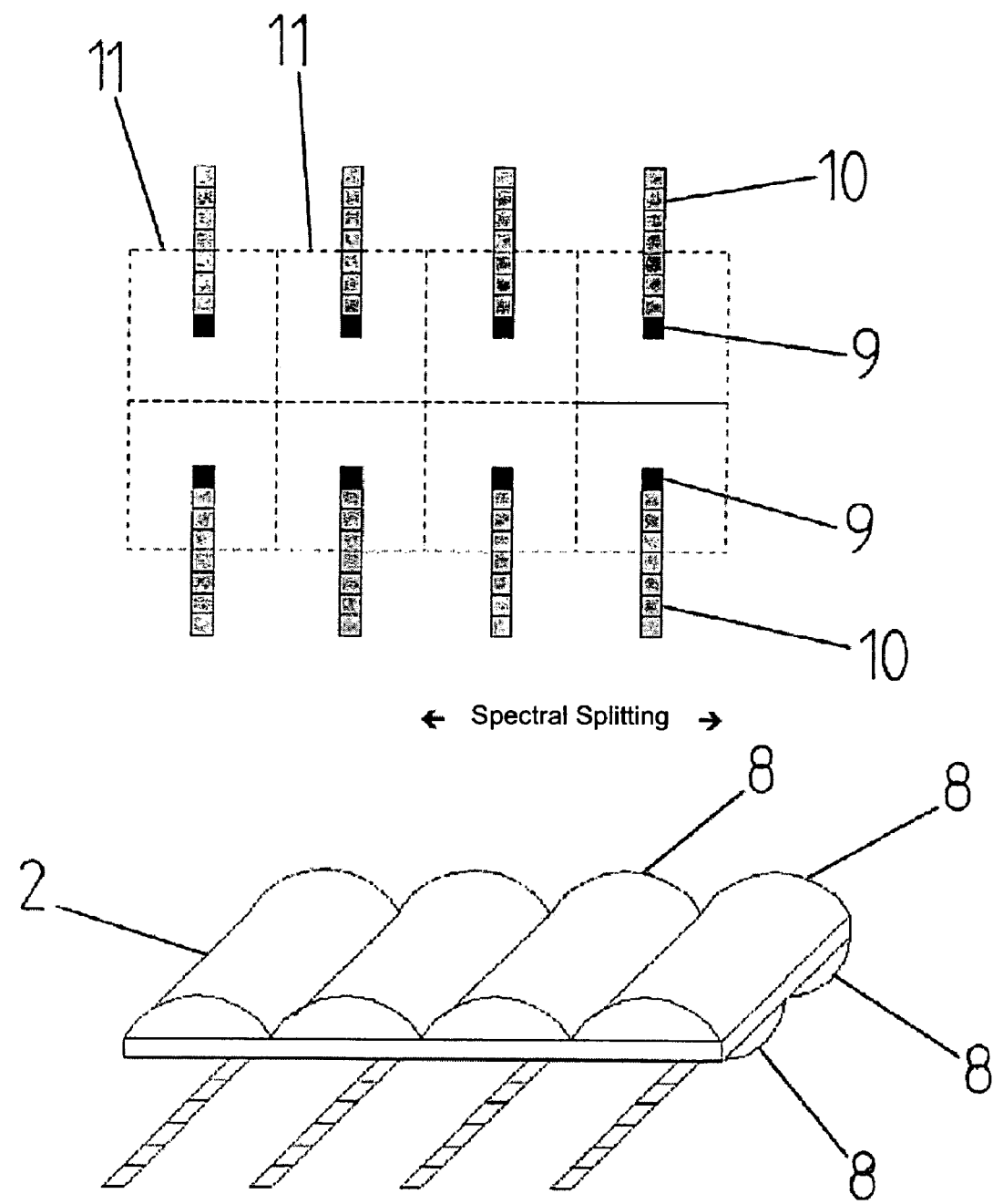

FIGS. 3, 4 and 5 each show microlens arrays 2 with individual microlenses 8. The microlenses 8 are arranged on the front and back of the same substrate. The embodiments shown in FIGS. 3 to 5 differ from each other in terms of the arrangement of the microlenses 8. Each microlens 8 is linked to a CCD pixel 9 with a shift register 10. Here, the broken lines indicate each detection surface 11 belonging to a microlens 8.

In the embodiment shown in FIG. 3, microlenses 8 of the same size are arranged equidistantly in the direction of the spectral splitting. In the embodiment shown in FIG. 4, the size of the microlenses 8 increases in the direction of the spectral splitting for purposes of achieving optimal adaptation in case of non-linear dispersion, for instance, with a prism 5. The distance of the CCD pixels 9 also increases correspondingly.

In the embodiment shown in FIG. 5, several CCD pixels 9, shown as parallelized CCD's, are arranged perpendicularly to the direction of the spectral splitting, which results in a correspondingly adapted microlens array 2 with an array of microlenses 8 on the top and another array of crossed microlenses 8 on the bottom of the substrate.

Figure 6:
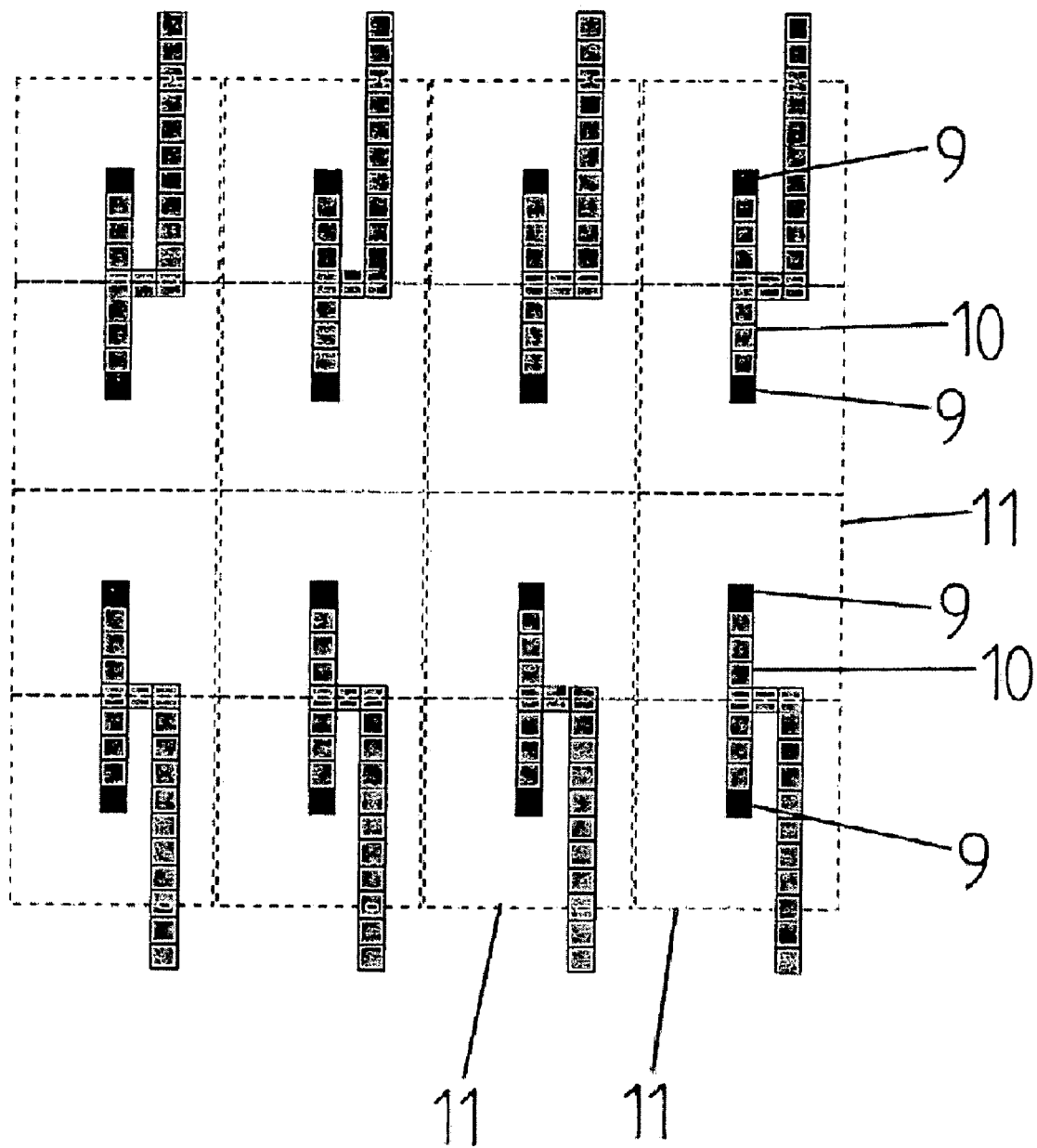

FIG. 6 shows the utilization of the gaps that have become free with the detector according to the invention, for purposes of electronic charge summation. Here, two CCD pixels 9 are each associated with one CCD shift register 10. However, the CCD pixels 9 are each associated with a detection surface 11.

Figure 7:
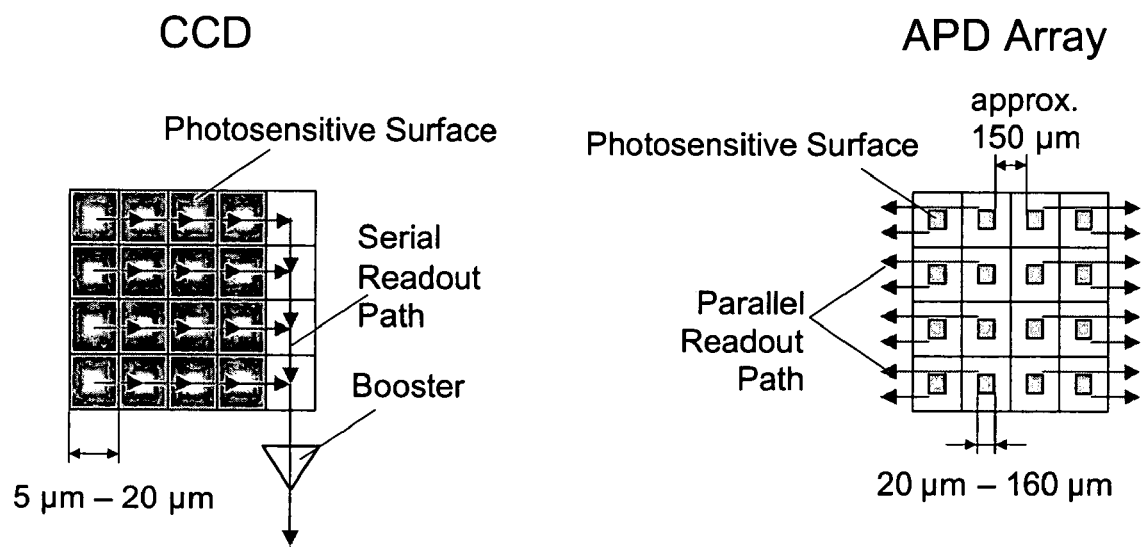

FIG. 7 shows a structural comparison between a CCD array and an APD array.

Regarding additional advantageous embodiments of the detector according to the invention, in order to avoid repetitions, reference is hereby made to the general part of the description as well as to the accompanying patent claims.

Figure 8:
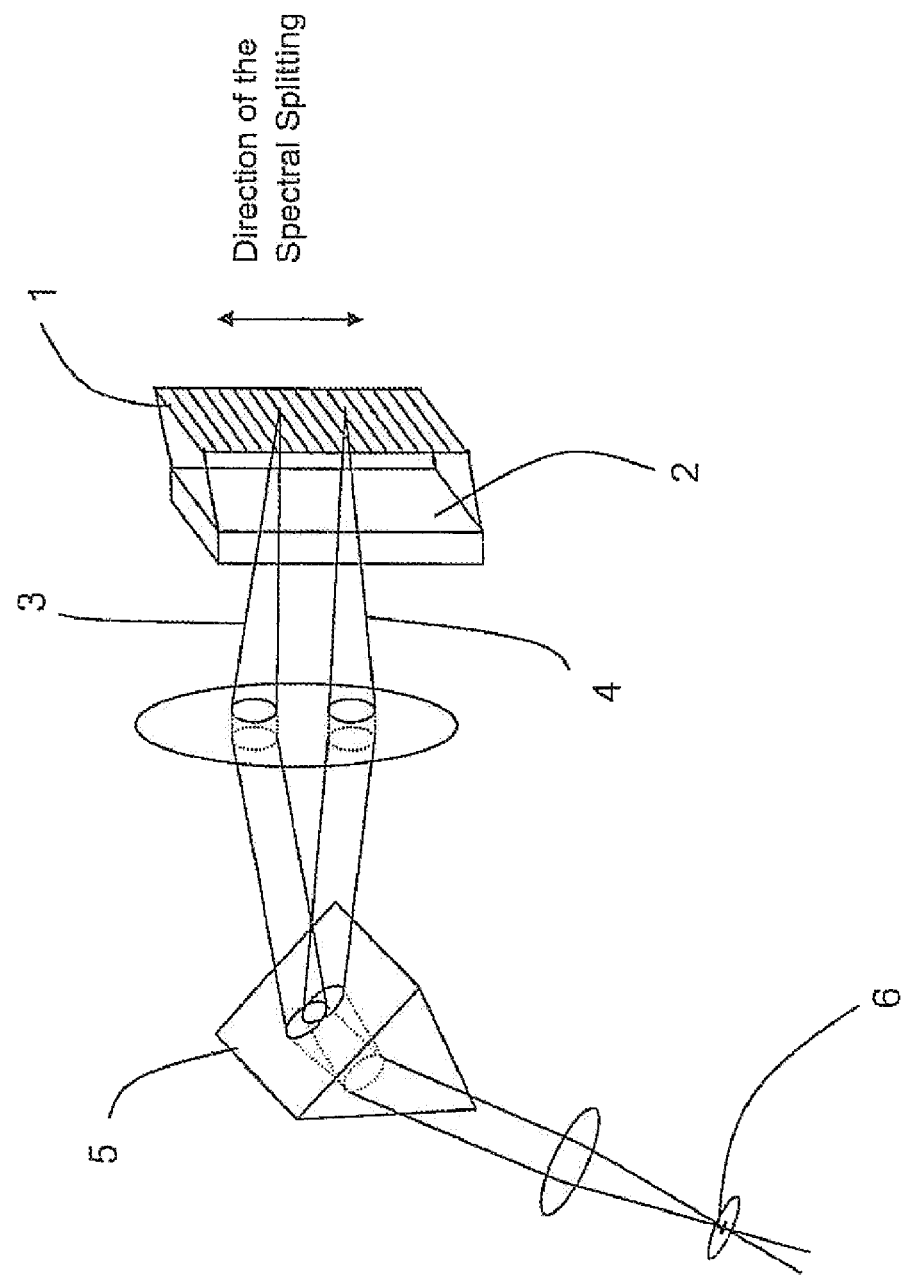
FIG. 8 a schematic view of another embodiment of a detector according to the invention in a beam path with spectral detection, FIG. 9 a schematic view of another embodiment of a microlens array, with a coating thereon.

FIG. 8 shows a microlens array 2 being used as a window for hermetically sealing the CCD array 1.

Figure 9:
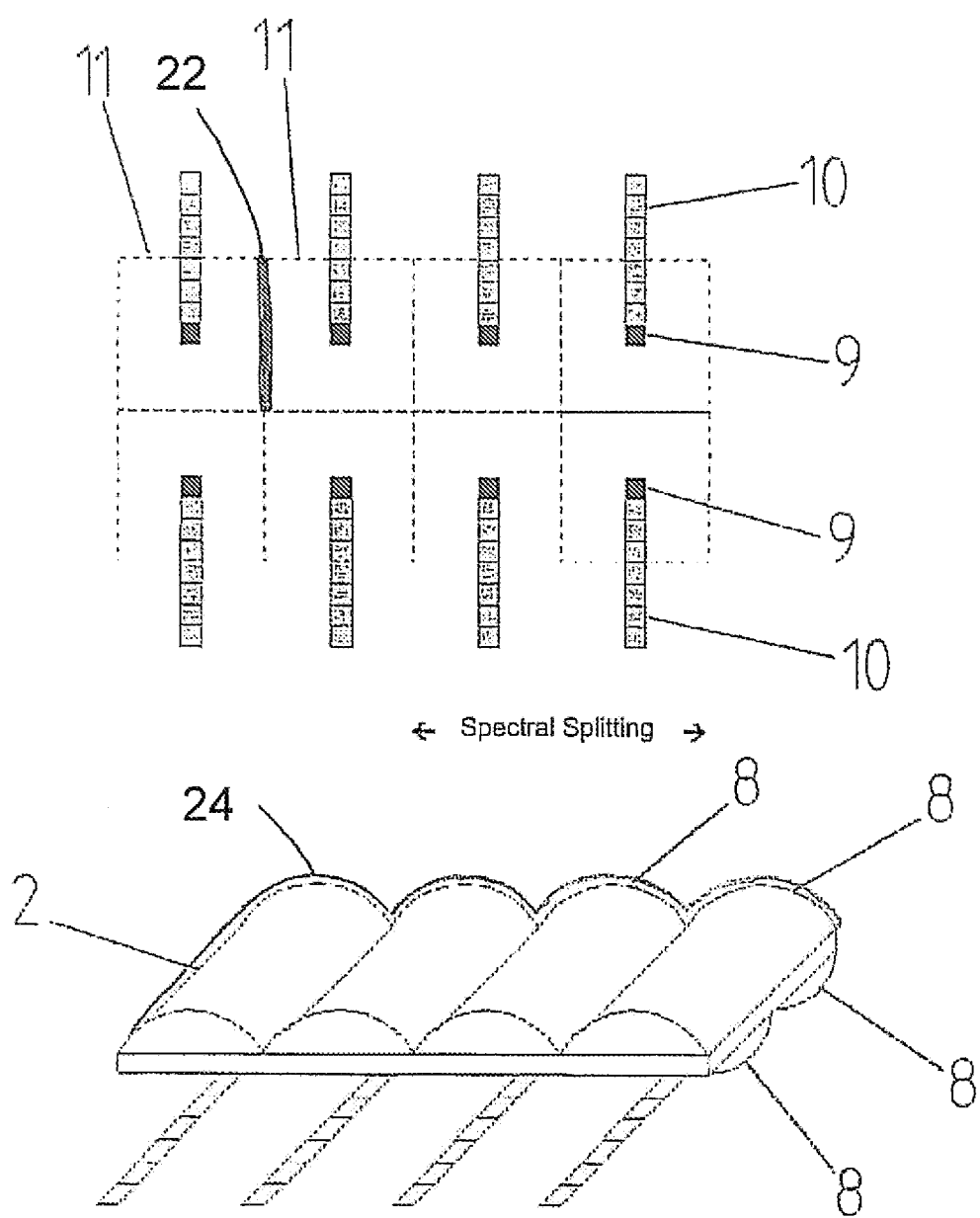

FIG. 9 shows that the space between pixels 9, can include an anti-blooming barrier 22. Further, the microlens 8 can include a coating 24 on its surface.

In conclusion, explicit mention should be made of the fact that the embodiments described above merely serve to elucidate the claimed teaching but that the latter should not be construed as being restricted to these embodiments.

What is claimed is:

1. A detector configured for spectral detection of light in a microscope, the detector comprising:
   a photosensitive array including at least one of a charge-coupled device array and an avalanche photodiode array, and including at least one photosensitive surface; and
   a focusing device configured to focus spectrally split light, onto the photosensitive array, the focusing device being disposed in an optical path upstream from the photosensitive array, the focusing device including a microlens array including at least one microlens, the at least one microlens including an array of cylindrical microlenses configured to focus with a first focal length in a direction of spectral splitting of the light and at least one cylindrical lens configured to focus with a second focal length in a direction perpendicular to the direction of the spectral splitting, the second focal length being different from the first focal length.

2. The detector as recited in claim 1 wherein the microlens array includes a two-dimensional microlens array.

3. The detector as recited in claim 1 wherein the at least one microlens includes at least one gradient-index lens.

4. The detector as recited in claim 1 wherein the at least one cylindrical lens includes at least one of a single cylindrical lens, a second array of cylindrical microlenses, a rod lens, and an array thereof.

5. The detector as recited in claim 1 wherein the microlens array includes a combination of two crossed arrays of at least one of non-cylindrical and cylindrical lenses.

6. The detector as recited in claim 1 wherein first microlenses of the at least one microlens are configured to focus in the direction of the spectral splitting and second microlenses of the at least one microlens are configured to focus in the direction perpendicular to the direction of the spectral splitting, the first and second microlenses being disposed on a same substrate.

7. The detector as recited in claim 6 wherein the first microlenses are disposed on a different side of the substrate from the second microlenses.

8. The detector as recited in claim 1 wherein the at least one photosensitive surface includes at least one of a deeply cooled charge-coupled device and a deeply cooled avalanche photodiode, and wherein the microlens array is configured as a window for sealing the at least one of the deeply cooled charge-coupled device an the deeply cooled avalanche photodiode.

9. The detector as recited in claim 8 wherein the sealing is a hermetic or vacuum sealing.

10. The detector as recited in claim 1 wherein a lens size of each microlens of the at least one microlens of the microlens array is adapted, in a direction of a spectral detection, to a respective spectral resolution at a respective wavelength.

11. The detector as recited in claim 1 wherein the at least one microlens is adapted to compensate for a chromatic error.

12. The detector as recited in claim 1 further comprising a shift register associated with a space created by the at least one microlens between light-sensitive pixels of the photosensitive array.

13. The detector as recited in claim 1 further comprising at least one anti-blooming barrier disposed in a space created by the at least one microlens between light-sensitive pixels of the photosensitive array.

14. The detector as recited in claim 1 wherein a space created by the at least one microlens between light-sensitive pixels of the photosensitive array is configured for absorbing scattered light.

15. The detector as recited in claim 1 wherein the microlens array is coated so as to increase transmission.

16. The detector as recited in claim 1 wherein the microlens array has a surface coating so as to at least one of increase an absorption of and reduce scattered light.

17. The detector as recited in claim 16 wherein the surface coating is a local surface coating.

18. The detector as recited in claim 1 wherein the microlens array is at least one of applied to, vapor-deposited on, and imprinted on the photosensitive array.

19. The detector as recited in claim 1 wherein the photosensitive array includes at least one of a charge-coupled device line array, an avalanche photodiode line array, a two-dimensional charge-coupled array, and a two-dimensional avalanche photodiode array.

20. The detector as recited in claim 1 wherein the photosensitive array includes a plurality of at least one of parallelized charge-coupled devices and parallelized avalanche photodiodes.

21. The detector as recited in claim 1 wherein the at least one photosensitive surface includes a front-illuminated EMCCD.

22. A spectrometer comprising a detector as recited in claim 1.

23. A microscope comprising a detector as recited in claim 1.

24. The microscope as recited in claim 23 wherein the microscope is a confocal or semi-confocal microscope.

25. The microscope as recited in claim 24 comprising at least one of a single detection pinhole, a multi-spot scanner, and a line scanner.

* * * * *